(12) United States Patent
Setlur et al.

(10) Patent No.: US 7,439,668 B2
(45) Date of Patent: Oct. 21, 2008

(54) OXYNITRIDE PHOSPHORS FOR USE IN LIGHTING APPLICATIONS HAVING IMPROVED COLOR QUALITY

(75) Inventors: Anant Achyut Setlur, Niskayuna, NY (US); Elena Alexandrovna Bachniak, Niskayuna, NY (US)

(73) Assignee: Lumination LLC, Valley View, OH (US)

( * ) Notice: Subject to any disclaimer, the term of this patent is extended or adjusted under 35 U.S.C. 154(b) by 388 days.

(21) Appl. No.: 11/068,713

(22) Filed: Mar. 1, 2005

(65) Prior Publication Data

US 2006/0197443 A1 Sep. 7, 2006

(51) Int. Cl.
*C09K 11/08* (2006.01)

(52) U.S. Cl. .............................. 313/503; 252/301.4 R; 252/301.4 F

(58) Field of Classification Search .......... 252/301.4 R, 252/301.4 F; 313/498–512
See application file for complete search history.

(56) References Cited

U.S. PATENT DOCUMENTS

| | | | |
|---|---|---|---|
| 5,998,925 A * | 12/1999 | Shimizu et al. ............. | 313/503 |
| 6,252,254 B1 | 6/2001 | Soules et al. | |
| 6,351,069 B1 | 2/2002 | Lowery et al. | |
| 6,580,097 B1 | 6/2003 | Soules et al. | |
| 6,649,946 B2 | 11/2003 | Bogner et al. | |
| 6,657,379 B2 | 12/2003 | Ellens et al. | |
| 6,670,748 B2 | 12/2003 | Ellens et al. | |
| 6,674,233 B2 | 1/2004 | Ellens et al. | |
| 6,680,569 B2 | 1/2004 | Mueller-Mach et al. | |
| 6,717,353 B1 | 4/2004 | Mueller et al. | |
| 2002/0105269 A1 | 8/2002 | Ellens et al. | |
| 2004/0056256 A1 | 3/2004 | Bokor et al. | |
| 2004/0135504 A1 | 7/2004 | Tamaki et al. | |
| 2004/0256974 A1 * | 12/2004 | Mueller-Mach et al. ..... | 313/485 |
| 2005/0242329 A1 | 11/2005 | Fiedler et al. | |
| 2006/0017365 A1 * | 1/2006 | Nagatomi et al. ........... | 313/485 |

FOREIGN PATENT DOCUMENTS

| | | |
|---|---|---|
| EP | 1 104 799 A1 | 6/2001 |
| EP | 1 445 295 | 8/2004 |
| JP | 2004-103814 | 4/2004 |
| JP | 2005008794 | 1/2005 |
| JP | 2005048105 | 2/2005 |
| WO | WO 01/39574 A1 | 6/2001 |
| WO | WO 2004/029177 A1 | 4/2004 |
| WO | WO 2004/055910 A1 | 7/2004 |
| WO | WO 2005/004202 | 1/2005 |
| WO | WO 2005/017066 | 2/2005 |

OTHER PUBLICATIONS

International Search Report for International Application No. PCT/US2006/007448.
W. Lehmann and F.M. Ryan, "Cathodulminescence of CaS:$Ce^{3+}$ and CaS:$Eu^{2+}$ Phosphors", J. Electrochem. Soc., Mar. 1971, vol. 118, pp. 477-482.

* cited by examiner

*Primary Examiner*—Nimeshkumar D. Patel
*Assistant Examiner*—Christopher M Raabe
(74) *Attorney, Agent, or Firm*—Fay Sharpe LLP

(57) ABSTRACT

Disclosed are oxynitride phosphor compositions having the formula $(RE_{1-x}Ce_x)_3Al_{a-y-z-w}Si_yGa_zSc_wO_{12-y}N_y$, where RE is at least one of Lu, Gd, Y, and Tb, $0.001 \leq x \leq 0.10$, $0 \leq w \leq 2$, $0.001 \leq y \leq 0.50$, $0 \leq z \leq 4.999$, and $4.5 \leq a \leq 5.0$. When combined with radiation from a blue or UV LED, these phosphors can provide light sources with good color quality having high CRI over a large color temperature range. Also disclosed are blends of the above oxynitride phosphors and additional phosphors.

23 Claims, 5 Drawing Sheets

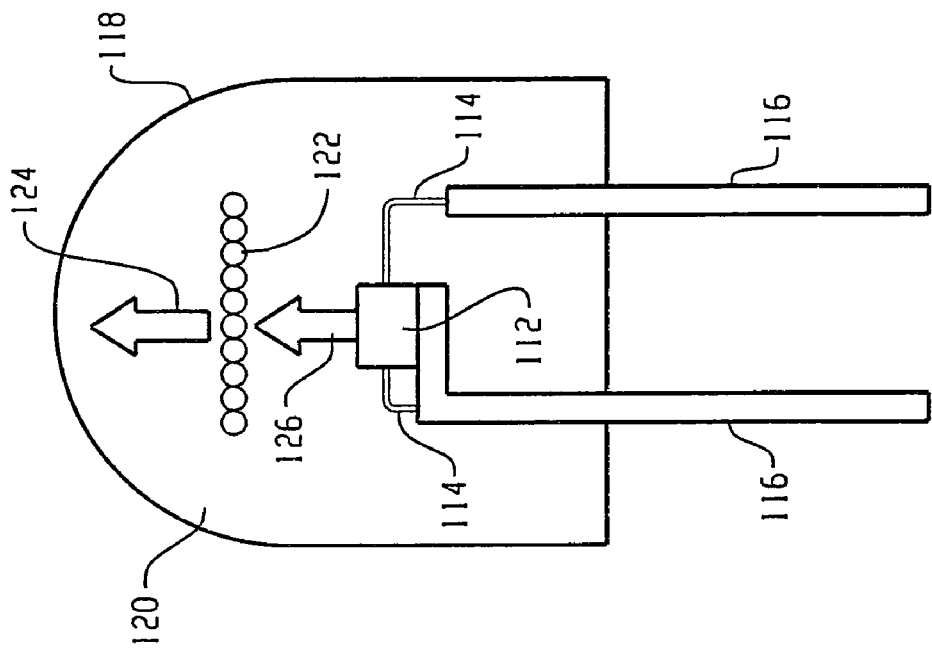
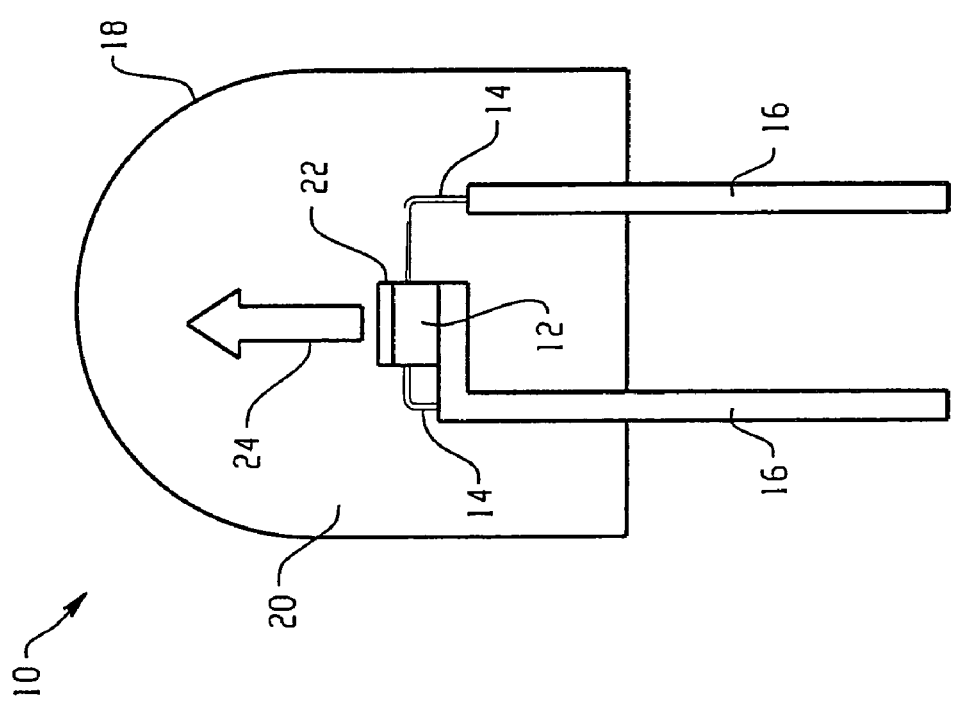

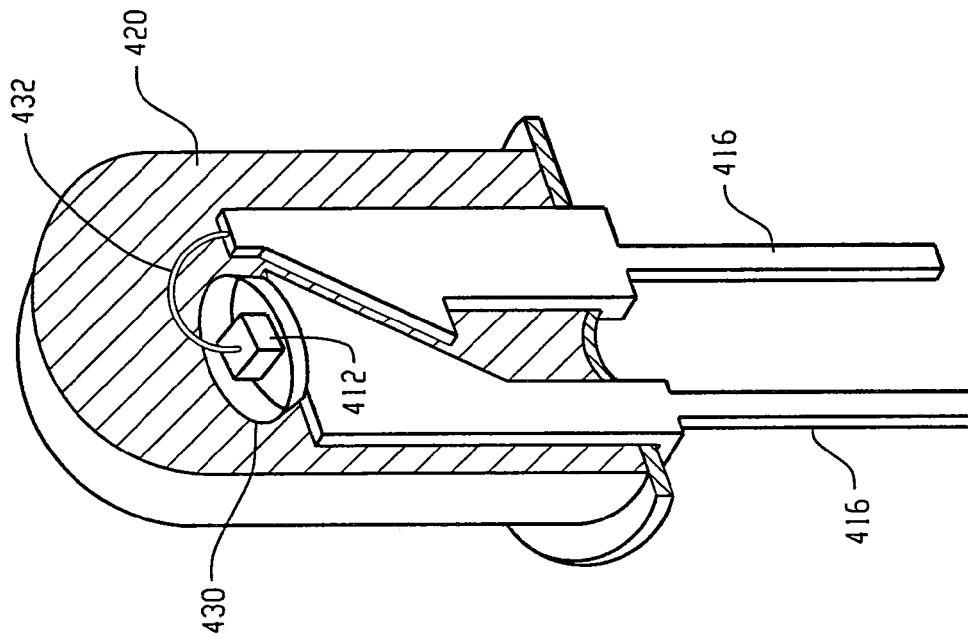
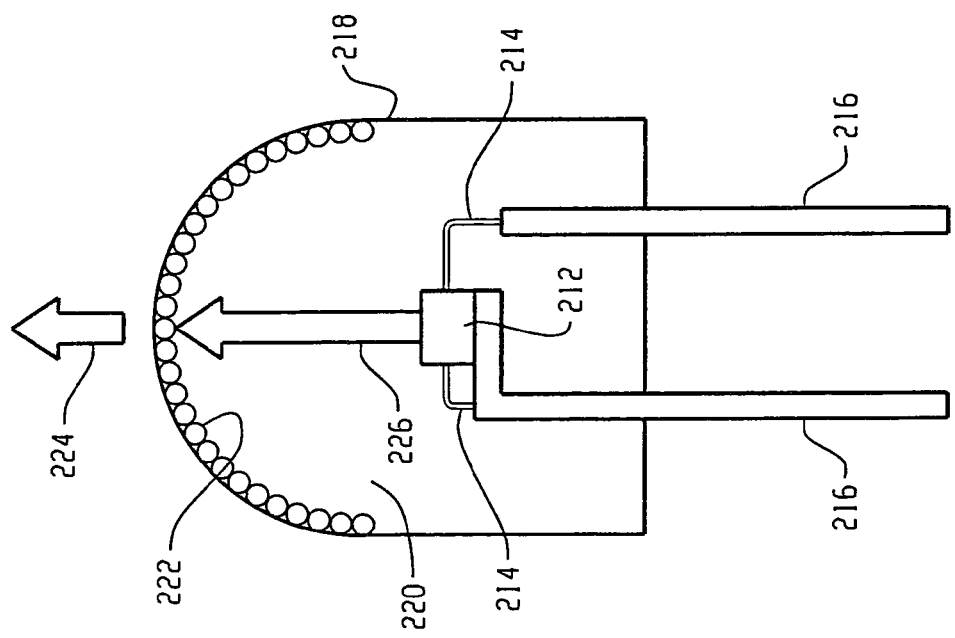
Fig. 4
Fig. 3

OXYNITRIDE PHOSPHORS FOR USE IN LIGHTING APPLICATIONS HAVING IMPROVED COLOR QUALITY

BACKGROUND

The present exemplary embodiments relate to novel phosphor compositions. They find particular application in conjunction with converting LED-generated ultraviolet (UV), violet or blue radiation into white light or other colored light for general illumination purposes. It should be appreciated, however, that the invention is also applicable to the conversion of radiation in Hg-based fluorescent lamps, as scintillating detector elements in computed tomography (CT) and positron emission tomography (PET), UV, violet and/or blue lasers, as well as other white or colored light sources for different applications.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green emission. The total of the light from the phosphor and the LED chip provides a color point with corresponding color coordinates (x and y) and correlated color temperature (CCT), and its spectral distribution provides a color rendering capability, measured by the color rendering index (CRI).

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value.

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}$: $Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

The blue LED-YAG phosphor device described above typically produces a white light with a general color rendering index ($R_a$) of from about 70-82 with a tunable color temperature range of from about 4000K to 8000K. Typical general lighting applications require a higher CRI and lower CCT values than possible using the blue LED-YAG approach. In an effort to improve the CRI, recent commercially available LEDs using a blend of YAG phosphor and one or more additional phosphors, including a red phosphor such as $CaS:Eu^{2+}$ or $(Ba, Sr, Ca)_2Si_5N_8:Eu^{2+}$ to provide color temperatures below 4000K with a $R_a$ around 90.

However, this adds an additional complication in that a phosphor blend is now used, limiting the potential phosphor coating options for these devices. In addition, many of the redder phosphors also strongly absorb the emission from YAG, consquently leading to further losses in the overall lamp performance.

Thus, there is a continued demand for additional phosphor compositions that can be used as a single phosphor component or as part of a phosphor blend in the manufacture of both white and colored LEDs as well as in other applications. Such phosphor compositions will allow an even wider array of LEDs with desirable properties including the ability to produce light sources with both good color quality (CRI>80) and a large range of color temperatures.

BRIEF DESCRIPTION

In a first aspect, there is provided a rare earth oxynitride phosphor comprising $(RE_{1-x}Ce_x)_3Al_{a-y-z-w}Si_yGa_zSc_wO_{12-y}N_y$, where RE is at least one of Lu, Gd, Y, and Tb, $0.001 \leq x \leq 0.10$, $0 \leq w \leq 2$, $0.001 \leq y \leq 0.50$, $0 \leq z \leq 4.999$, and $4.5 \leq a \leq 5.0$.

In a second aspect, there is provided a light emitting device including a semiconductor light source having a peak emission from about 250 to about 550 nm and a rare earth oxynitride phosphor as defined above.

In a third aspect, there is provided a phosphor blend including a first rare earth oxynitride phosphor as defined-above and at least one additional phosphor, wherein the phosphor blend is capable of emitting light suitable for use in general illumination either alone or in combination with radiation emitted by a semiconductor light source radiationally coupled to the phosphor blend.

BRIEF DESCRIPTION OF THE DRAWINGS

FIG. 1 is a schematic cross-sectional view of an illumination system in accordance with one embodiment of the present invention.

FIG. 2 is a schematic cross-sectional view of an illumination system in accordance with a second embodiment of the present invention.

FIG. 3 is a schematic cross-sectional view of an illumination system in accordance with a third embodiment of the present invention.

FIG. 4 is a cutaway side perspective view of an illumination system in accordance with a fourth embodiment of the present invention.

DETAILED DESCRIPTION

Figure 5A:
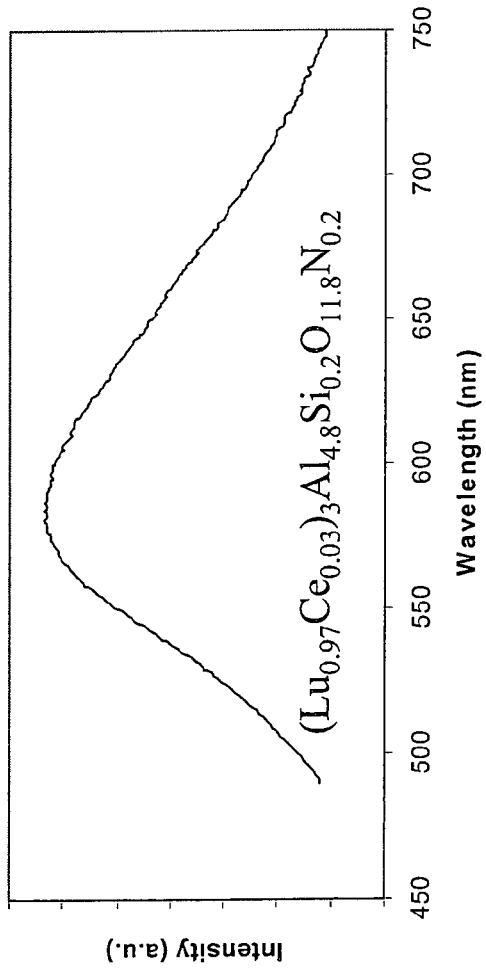
FIGS. 5a-5d are the emission spectra of several of the present embodiment phosphors under 470 nm excitation.
Figure 5B:
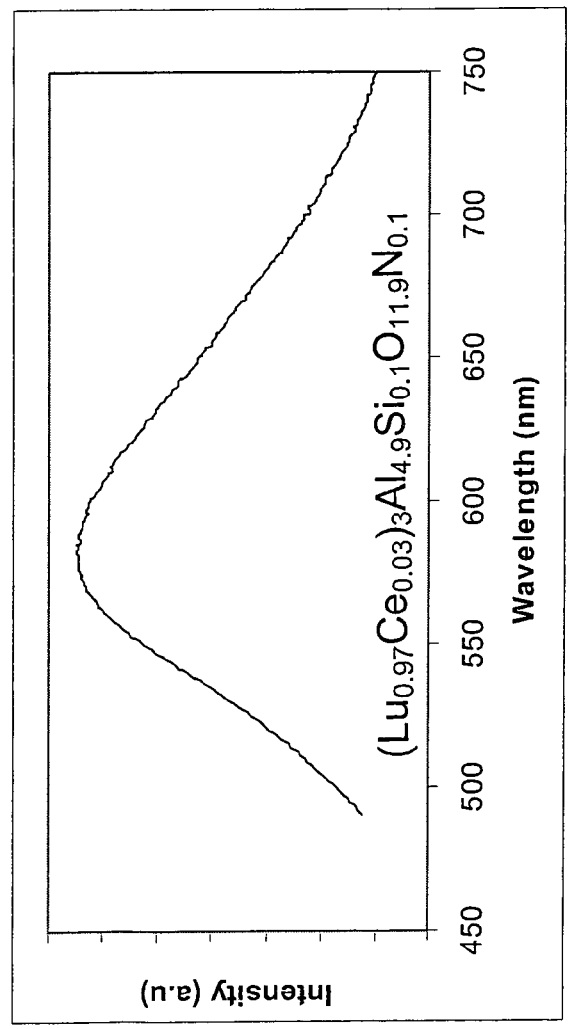
Figure 5C:
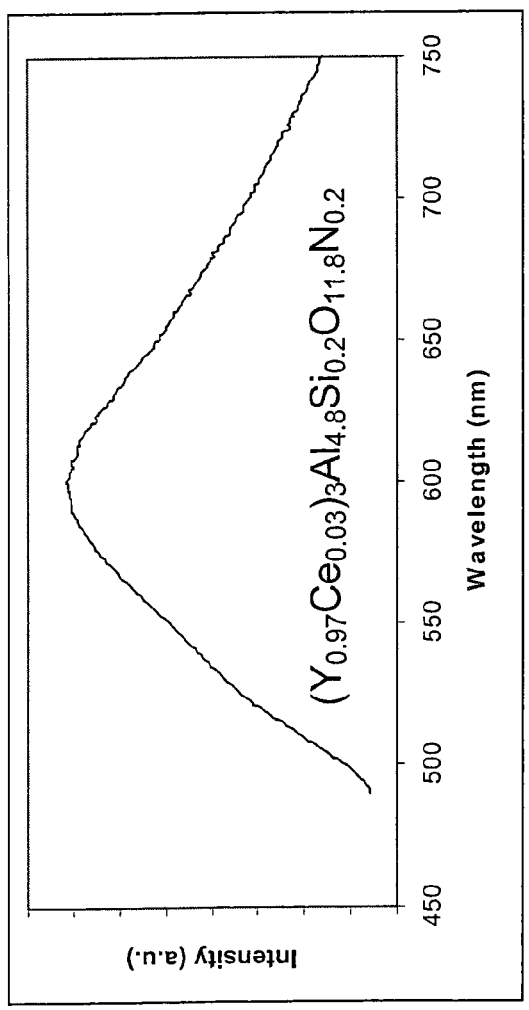
Figure 5D:
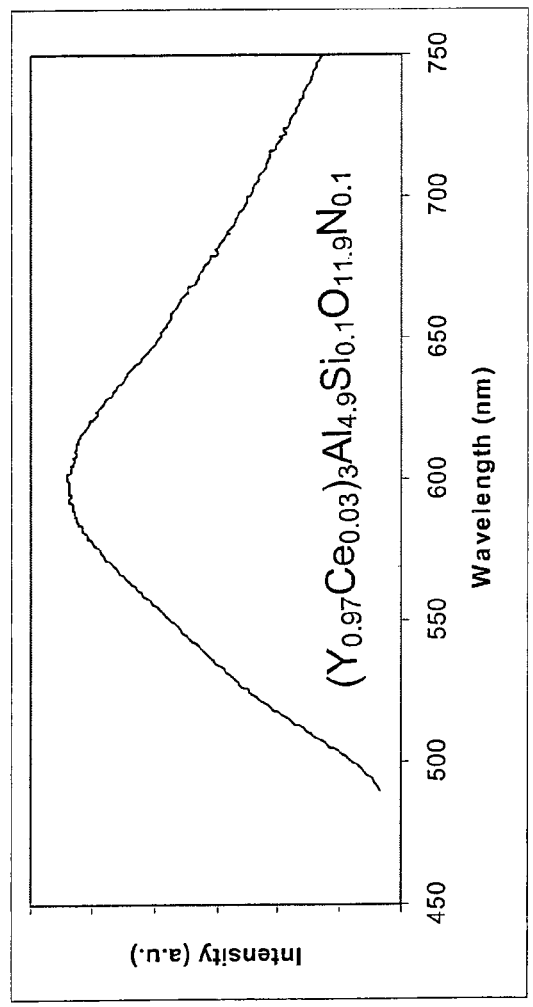

Phosphors convert radiation (energy) to visible light. Different combinations of phosphors provide different colored light emissions. The colored light that originates from the phosphors provides a color temperature. Novel phosphor compositions are presented herein as well as their use in LED and other light sources.

A phosphor conversion material (phosphor material) converts generated UV or blue radiation to a different wavelength visible light. The color of the generated visible light is dependent on the particular components of the phosphor material. The phosphor material may include only a single phosphor composition or two or more phosphors of basic color, for example a particular mix with one or more of a yellow and red phosphor to emit a desired color (tint) of light. As used herein, the term "phosphor material" is intended to include both a single phosphor as well as a blend of two or more phosphors.

It was determined that an LED lamp that produces a bright-white light would be useful to impart desirable qualities to LEDs as light sources. Therefore, in one embodiment of the invention, a luminescent material phosphor conversion material coated LED chip is disclosed for providing white light. The phosphor material may be an individual phosphor or a phosphor blend of two or more phosphor compositions, including individual phosphors that convert radiation at a specified wavelength, for example radiation from about 250 to 550 nm as emitted by a UV to visible LED, into a different wavelength visible light. The visible light provided by the phosphor material (and LED chip if emitting visible light) comprises a bright white light with high intensity and brightness.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The lamp may include any semiconductor visible or UV light source that is capable of producing white light when its emitted radiation is directed onto the phosphor. The preferred peak emission of the LED chip in the present invention will depend on the identity of the phosphors in the disclosed embodiments and may range from, e.g., 250-550 nm. In one preferred embodiment, however, the emission of the LED will be in the near UV to deep blue region and have a peak wavelength in the range from about 350 to about 430 nm. Typically then, the semiconductor light source comprises an LED doped with various impurities. Thus, the LED may comprise a semiconductor diode based on any suitable III-V, II-VI or IV-IV semiconductor layers and having an emission wavelength of about 250 to 550 nm.

Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 550 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin on glass or some other high index of refraction material. Preferably, the encapsulant material 20 is an epoxy or a polymer material, such as silicone. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so radiation from one is transmitted to the other.

This phosphor material 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of the phosphor material 22 and LED 12. Thus, the phosphor material 22 may be coated over or directly on the light emitting surface of the LED chip 12 by coating and drying the phosphor suspension over the LED chip 12. Both the shell 18 and the encapsulant 20 should be transparent to allow light 24 to be transmitted through those elements. Although not intended to be limiting, in one embodiment, the median particle size of the phosphor material may be from about 1 to about 10 microns.

FIG. 2 illustrates a second preferred structure of the system according to the preferred aspect of the present invention. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

FIG. 3 illustrates a third preferred structure of the system according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, the invention provides a novel phosphor composition, which may be used in the phosphor composition 22 in the above described LED light, wherein the composition is a rare earth oxynitride phosphor composition having a formula $(RE_{1-x}Ce_x)_3Al_{a-y-z-w}Si_yGa_zSc_wO_{12-y}N_y$, where RE is at least one of Lu, Gd, Y, and Tb, $0.001 \leq x \leq 0.10$, $0 \leq w \leq 2$, $0.001 \leq y \leq 0.50$, $0 \leq z \leq 4.999$, and $4.5 \leq a \leq 5.0$. Preferably, $0.01 \leq y \leq 0.05$, $0.02 \leq y \leq 0.20$, $0 \leq w \leq 0.5$, $0 \leq z \leq 0.5$, and $4.8 \leq a \leq 5.0$. Even more preferably, $0.05 \leq y \leq 0.20$.

Preferred phosphors in this embodiment include $(Lu_{0.97}Ce_{0.03})_3Al_{4.8}Si_{0.2}O_{11.8}N_{0.2}$, $(Lu_{0.97}Ce_{0.03})_3Al_{4.9}Si_{0.1}O_{11.9}N_{0.1}$, $(Y_{0.97}Ce_{0.03})_3Al_{4.9}Si_{0.1}O_{11.9}N_{0.1}$, and $(Y_{0.97}Ce_{0.03})_3Al_{4.8}Si_{0.2}O_{11.8}N_{0.2}$.

Figure 6A:
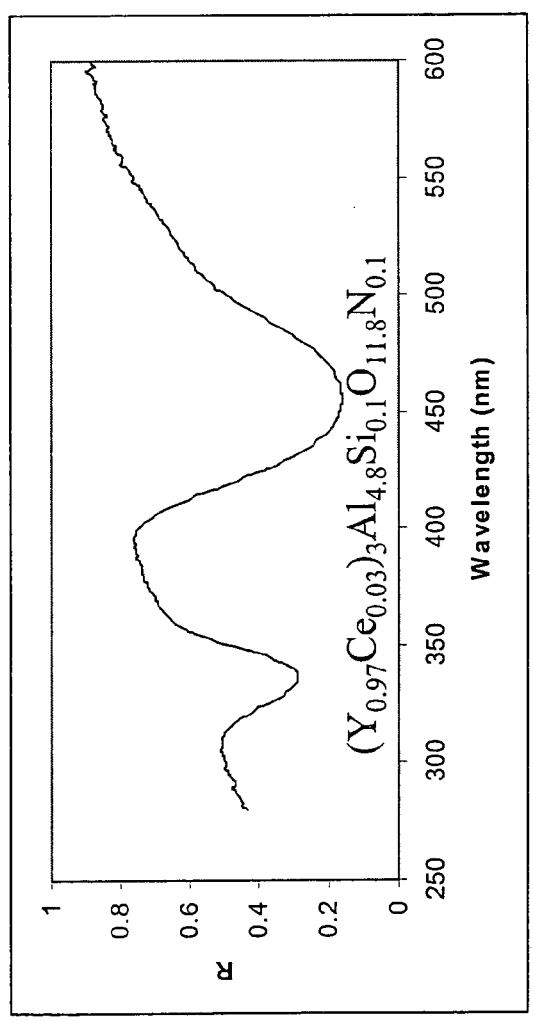
FIGS. 6a-6b are the diffuse reflectance spectra for $(Y_{0.97}Ce_{0.03})_3Al_{4.9}Si_{0.1}O_{11.9}N_{0.1}$ and $(Lu_{0.97}Ce_{0.03})_3Al_{4.8}Si_{0.2}O_{11.8}N_{0.2}$, respectively.
Figure 6B:
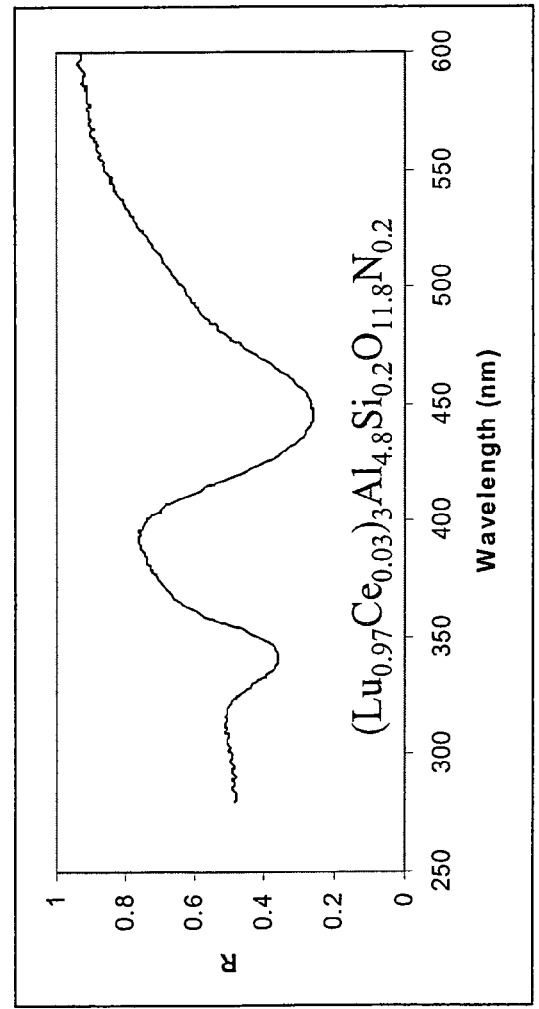

FIGS. 5a-5d are the emission spectra of the above phosphors under 470 nm excitation. FIGS. 6a-6b are the diffuse reflectance spectra for $(Y_{0.97}Ce_{0.03})_3Al_{4.9}Si_{0.2}O_{11.9}N_{0.2}$ and $(Lu_{0.97}Ce_{0.03})_3Al_{4.8}Si_{0.2}O_{11.8}N_{0.2}$, respectively.

The use of $Ce^{3+}$ as a dopant may increase the efficiency of the resulting lighting device when other phosphors are present. That is, because $Eu^{2+}$ doped phosphors are known to absorb the radiation emitted by other phosphors present in the device while $Ce^{3+}$ typically does not, this has the additional benefit of increasing the device package efficiency when additional phosphors are present (such as YAG), since less of the light emitted by these phosphors will be absorbed due to the lower concentration of $Eu^{2+}$. In one embodiment, the $Ce^{3+}$ doping levels may range from about 0.01 to about 30 mol % replacement.

While suitable in many applications alone with a blue or UV LED chip, the above described oxonitride phosphor may be blended with one or more additional phosphors for use in LED light sources. Thus, in another embodiment, an LED lighting assembly is provided including a phosphor composition comprising a blend of a phosphor from one of the above embodiments with one or more additional phosphors. These phosphors can be used either individually for single color lamps or in blends with other phosphors to generate white light for general illumination. These phosphors can be blended with suitable phosphors to produce a white light emitting device with CCTs ranging from 2500 to 10,000 K and CRIs ranging from 50-99. Non-limiting examples of suitable phosphors for use with the present inventive phosphors in phosphor blends are listed below.

The specific amounts of the individual phosphors used in the phosphor blend will depend upon the desired color temperature. The relative amounts of each phosphor in the phosphor blend can be described in terms of spectral weight. The spectral weight is the relative amount that each phosphor contributes to the overall emission spectrum of the device. The spectral weight amounts of all the individual phosphors and any residual bleed from the LED source should add up to 100%. In a preferred embodiment of blended phosphors, the above described phosphor in the blend will have a spectral weight ranging from about 1 to 75%.

Non-limiting examples of suitable phosphors that may be used in combination with the present oxonitridosilicate phosphors include:

$(Ba, Sr, Ca)_5(PO_4)_3(Cl, F, Br, OH):Eu^{2+}, Sb^{3+}$
$(Ba, Sr, Ca)MgAl10O_{17}:Eu^{2+},Mn^{2+}$
$(Ba, Sr, Ca)BPO_5:Eu^{2+}, Mn^{2+}$
$(Sr, Ca)_{10}(PO_4)_6*nB_2O_3:Eu^{2+}$
$Sr_2Si_3O_8*2SrCl_2:Eu^{2+}$
$Ba_3MgSi_2O_8:Eu^{2+}$
$Sr_4Al_{14}O_{25}:Eu^{2+}$
$BaAl_8O_{13}:Eu^{2+}$
$2SrO*0.84P_2O_5*0.16B_2O_3:Eu^{2+}$
$(Ba, Sr, Ca)MgAl_{10}O_{17}:Eu^{2+},Mn^{2+}$
$(Ba, Sr, Ca, Zn)_5(PO_4)_3(Cl, F, OH):Eu^{2+},Mn^{2+}, Sb^{3+}$
$(Ba, Sr, Ca)MgAl_{10}O_{17}:Eu^{2+},Mn^{2+}$ (BAMn)
$(Ba, Sr, Ca)Al_2O_4:Eu^{2+}$
$(Y, Gd, Lu, Sc, La)BO_3:Ce^{3+}, Tb^{3+}$
$Ca_8Mg(SiO_4)_4Cl_2:Eu^{2+},Mn^{2+}$
$(Ba, Sr, Ca)_2SiO_4:Eu^{2+}$
$(Ba, Sr, Ca)_2(Mg, Zn)Si_2O_7:Eu^{2+}$
$(Sr, Ca, Ba)(Al, Ga, In)_2S_4:Eu^{2+}$
$(Y, Gd, Tb, La, Sm, Pr, Lu)_3(Al, Ga)_5O_{12}:Ce^{3+}$
$(Ca, Sr)_8(Mg, Zn)(SiO_4)_4Cl_2:Eu^{2+}, Mn^{2+}$ (CASI)
$Na_2Gd_2B_2O_7:Ce^{3+}, Tb^{3+}$
$(Ba, Sr)_2(Ca, Mg, Zn)B_2O_6:K, Ce, Tb$
$(Sr, Ca, Ba, Mg, Zn)_2P_2O_7:Eu^{2+}, Mn^{2+}$ (SPP);
$(Ca, Sr, Ba, Mg)_{10}(PO_4)_6(F, Cl, Br, OH): Eu^{2+}, Mn^{2+}$ (HALO);
$(Gd, Y, Lu, La)_2O_3:Eu^{3+}, Bi^{3+}$
$(Gd, Y, Lu, La)_2O_2S:Eu^{3+}, Bi^{3+}$
$(Gd, Y, Lu, La)VO_4:Eu^{3+}, Bi^{3+}$
$(Ca, Sr)S:Eu^{2+}$
$SrY_2S_4: Eu^{2+}$
$CaLa_2S_4:Ce^{3+}$
$(Ca, Sr)S:Eu^{2+}$
$3.5MgO*0.5MgF_2*GeO_2:Mn^{4+}$ (MFG)

$(Ba, Sr, Ca)MgP_2O_7:Eu^{2+}, Mn^{2+}$
$(Y,Lu)_2WO_6:Eu^{3+}, Mo^{6+}$
$(Ba, Sr, Ca)_xSi_yN_z:Eu^{2+}$

Preferred phosphors for use in blends with the present oxynitride phosphors include $(Sr,Ca)S:Ce^{3+},Eu^{2+}$; $(Sr,Ba,Ca)_2Si_{5-x}Al_xN_{8-x}O_x: Ce^{3+}, Eu^{2+}$; and $BaSi_7N_{10}:Ce^{3+},Eu^{2+}$.

As stated, the inventive phosphors can be used either alone to make single color light sources or in blends for white light sources. In one preferred embodiment, the phosphor composition is a blend of the above oxynitride phosphor and one or more gap filling phosphors, such that the light emitted from the LED device is a white light.

When the phosphor composition includes a blend of two or more phosphors, the ratio of each of the individual phosphors in the phosphor blend may vary depending on the characteristics of the desired light output. The relative proportions of the individual phosphors in the various embodiment phosphor blends may be adjusted such that when their emissions are blended and employed in an backlighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor in the phosphor composition can be varied according to the needs of the end user.

The above described phosphor composition may be produced using known solution or solid state reaction processes for the production of phosphors by combining, for example, elemental nitrides, oxides, carbonates and/or hydroxides as starting materials. Other starting materials may include nitrates, sulfates, acetates, citrates, or oxalates. Alternately, coprecipitates of the rare earth oxides could be used as the starting materials for the RE elements. In a typical process, the starting materials are combined via a dry or wet blending process and fired in air or under a reducing atmosphere or in ammonia at from, e.g., 1000 to 1600° C.

A fluxing agent may be added to the mixture before or during the step of mixing. This fluxing agent may be $AlF_3$, $NH_4Cl$ or any other conventional fluxing agent, such as a fluoride of at least one metal selected from the group consisting of lutetium, yttrium, terbium, aluminum, gallium, and indium. A quantity of a fluxing agent of less than about 20, preferably less than about 10, percent by weight of the total weight of the mixture is generally adequate for fluxing purposes.

The starting materials may be mixed together by any mechanical method including, but not limited to, stirring or blending in a high-speed blender or a ribbon blender. The starting materials may be combined and pulverized together in a bowl mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 1400° C. to about 1600° C., for a time sufficient to convert all of the mixture to the final composition.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate but for phase formation it is desirable to refire couple of times at the desired temperatures after grinding. The reducing atmosphere typically comprises a reducing gas such as hydrogen, carbon monoxide, ammonia or a combination thereof, optionally diluted with an inert gas, such as nitrogen, helium, etc., or a combination thereof. A typical firing atmosphere is 1% $H_2$ in nitrogen. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

It may be desirable to add pigments or filters to the phosphor composition. When the LED is a UV emitting LED, the phosphor layer 22 may also comprise from 0 up to about 5 % by weight (based on the total weight of the phosphors) of a pigment or other UV absorbent material capable of absorbing or reflecting UV radiation having a wavelength between 250 nm and 550 nm.

Suitable pigments or filters include any of those known in the art that are capable of absorbing radiation generated between 250 nm and 550 nm. Such pigments include, for example, nickel titanate or praseodymium zirconate. The pigment is used in an amount effective to filter 10% to 100% of the radiation generated in any of the 250 nm to 550 nm range.

CALCULATED EXAMPLES

The calculated characteristics of LED based lights using a 470 nm LED chip and various embodiments of the present oxynitride phosphors are listed below.

| Phosphor | Luminosity (lm/W-opt) | CCT | CRI |
| --- | --- | --- | --- |
| $(Lu_{0.97}Ce_{0.03})_3Al_{4.8}Si_{0.2}O_{11.8}N_{0.2}$ | 293 | 3840 | 83.5 |
| $(Y_{0.97}Ce_{0.03})_3Al_{4.9}Si_{0.1}O_{11.9}N_{0.1}$ | 285 | 3100 | 84 |
| $(Y_{0.97}Ce_{0.03})_3Al_{4.8}Si_{0.2}O_{11.8}N_{0.2}$ | 292 | 3480 | 84 |

It can be seen that the use of the present phosphors alone can provide higher lights with higher CRI than possible using YAG over a range of CCT's <4000K with comparable quantum efficiencies.

When used in lighting applications as part of a phosphor blend, by assigning appropriate spectral weights for each phosphor, we can create spectral blends to cover the relevant portions of color space, especially for white lamps. For various desired CCT's, CRI's and color points, one can determine the appropriate amounts of each phosphor to include in the blend. Thus, one can customize phosphor blends to produce almost any CCT or color point, with corresponding high CRI. Of course, the color of each phosphor will be dependent upon its exact composition. However, determining the changes in the spectral weight to produce the same or similar characteristic lighting device necessitated by such variations is trivial and can be accomplished by one skilled in the art using various methodologies, such as design of experiment (DOE) or other strategies.

By use of the present invention, single phosphor lamps can be provided having CRI values greater than those achievable using YAG alone over a wide range of color temperatures. In addition, the use of the present oxynitride phosphors in LED blends can produce lamps with CRI values over 90, over the entire range of color temperatures of interest for general illumination (2500 K to 8000 K). In some blends, the CRI values may approach the theoretical maximum of 100.

The phosphor composition described above may be used in additional applications besides LEDs. For example, the material may be used as a phosphor in a Hg fluorescent lamp, in a cathode ray tube, in a plasma display device or in a liquid crystal display (LCD). The material may also be used as a scintillator in an electromagnetic calorimeter, in a gamma ray camera, in a computed tomography scanner, as scintillator detector elements in a CT or PET system, or in a laser. These uses are meant to be merely exemplary and not exhaustive.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A lighting apparatus for emitting white light comprising:
a light source emitting with a peak radiation at from about 250 nm to about 550 nm; and
a phosphor composition radiationally coupled to the light source, the phosphor composition comprising a rare earth oxynitride phosphor comprising $(RE_{1-x}Ce_x)_3Al_{a-y-z-w}Si_yGa_zSc_wO_{12-y}N_y$, where RE is at least one of Lu, Gd, Y, and Tb, $0.001 \leq x \leq 0.10$, $0 \leq w \leq 2$, $0.001 \leq y \leq 0.50$, $0 \leq z \leq 4.999$, and $4.5 \leq a \leq 5.0$.

2. The lighting apparatus of claim 1, wherein the light source is a semiconductor light emitting diode (LED) emitting radiation having a wavelength in the range of from about 370 to about 485 nm.

3. The lighting apparatus of claim 2, wherein the LED comprises a nitride compound semiconductor represented by the formula $In_iGa_jAl_kN$, where $0<i$; $0 \leq j$, $0 \leq K$, and $i+j+k=1$.

4. The lighting apparatus of claim 1, wherein the light source is an organic emissive structure.

5. The lighting apparatus of claim 1, wherein the phosphor composition is coated on the surface of the light source.

6. The lighting apparatus of claim 1, further comprising an encapsulant surrounding the light source and the phosphor composition.

7. The lighting apparatus of claim 1, wherein the phosphor composition is dispersed in the encapsulant.

8. The lighting apparatus of claim 1, further comprising a reflector cup.

9. The lighting apparatus of claim 1, wherein said phosphor composition further comprises one or more additional phosphor.

10. The lighting apparatus of claim 9, wherein said one or more additional phosphors are selected from the group consisting of $(Ba,Sr,Ca)_5(PO_4)_3(Cl,F,Br,OH):Eu^{2+}$, $Sb^{3+}$; $(Ba, Sr, Ca)MgAl10O_{17}:Eu^{2+},Mn^{2+}$; $(Ba,Sr,Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $Ba_3MgSi_2O_8:Eu^{2+}$; $Sr_4Al_{14}O_{25}:Eu^{2+}$; $BaAl_8O_{13}:Eu^{2+}$; $Sr_4Al_{14}O_{25}:Eu^{2+}$; $BaAl_8O_{13}:Eu^{2+}$; $(Ba, Sr, Ca)Al_2O_4:Eu^{2+}$; $(Y,Gd,Lu,Sc,La)BO_3:Ce^{3+}$, $Tb^{3+}$; $Ca_8Mg(SiO_4)_4Cl_2:Eu^{2+}$; $Mn^{2+}$; $(Ba, Sr, Ca)_2SiO_4:Eu^{2+}$; $(Ba,Sr,Ca)_2(Mg, Zn)Si_2O_7:Eu^{2+}$; $(Sr,Ca,Ba)(Al, Ga, In)_2S_4:Eu^{2+}$; $(Y,Gd,Tb,La,Sm,Pr,Lu)_3(Al,Ga)_5O_{12}:Ce^{3+}$; $(Ca,Sr)_8(Mg, Zn)(SiO_4)_4Cl_2$: $Eu^{2+}$, $Mn^{2+}$ (CASI); $Na_2Gd_2B_2O_7:Ce^{3+}$, $Tb^{3+}$; $(Ba,Sr)_2(Ca,Mg, Zn)B_2O_6:K, Ce, Tb$; $(Sr,Ca,Ba,Mg,Zn)_2P_2O_7:Eu^{2+}$, $Mn^{2+}$ (SPP); $(Ca,Sr, Ba,Mg)_{10}(PO_4)_6(F,Cl,Br,OH):Eu^{2+}$, $Mn^{2+}$; $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $(Ca,Sr)S:Eu^{2+}$; $SrY_2S_4$: $Eu^{2+}$; $CaLa_2S_4:Ce^{3+}$; $3.5MgO*0.5MgF_2*GeO_2:Mn^{4+}$; $(Ba, Sr, Ca)MgP_2O_7:Eu^{2+}$, $Mn^{2+}$; $(Y, Lu)_2WO_6:Eu^{3+}, Mo^{6+}$; $(Ba,Sr,Ca)_xSi_yN_z:Eu^{2+}$.

11. The lighting apparatus of claim 9, wherein said one or more additional phosphors comprises at least one of $(Sr,Ca)S:Ce^{3+},Eu^{2+}$; $(Sr,Ba, Ca)_2Si_{5-x}Al_xN_{8-x}O_x$: $Ce^{3+},Eu^{2+}$; and $BaSi_7N_{10}$: $Ce^{3+},Eu^{2+}$.

12. The lighting apparatus of claim 1, wherein said phosphor composition comprises at least one of $(Lu_{0.97}Ce_{0.03})_3Al_{4.8}Si_{0.2}O_{11.8}N_{0.2}$, $(Lu_{0.97}Ce_{0.03})_3Al_{4.9}Si_{0.1}O_{11.9}N_{0.1}$, $(Y_{0.97}Ce_{0.03})_3Al_{4.9}Si_{0.1}O_{11.9}N_{0.1}$, and $(Y_{0.97}Ce_{0.03})_3Al_{4.8}Si_{0.2}O_{11.8}N_{0.2}$.

13. The lighting apparatus of claim 1, wherein $0.01 \leq x \leq 0.05$, $0.02 \leq y \leq 0.20$, $0 \leq z \leq 0.5$, $0 \leq w \leq 0.5$, and $4.8 \leq a \leq 5.0$.

14. A phosphor composition comprising an oxynitride phosphor comprising $(RE_{1-x}Ce_x)_3Al_{a-y-z-w}Si_yGa_zSc_wO_{12-y}N_y$, where RE is at least one of Lu, Gd, Y, and Tb, $0.001 \leq x \leq 0.10$, $0 \leq w \leq 2$, $0.001 \leq y \leq 0.50$, $0 \leq z \leq 4.999$, and $4.5 \leq a \leq 5.0$.

15. The phosphor composition of claim 14, wherein $0.01 \leq x \leq 0.05$, $0.02 \leq y \leq 0.20$, $0 \leq z \leq 0.5$, $0 \leq w \leq 0.5$, and $4.8 \leq a \leq 5.0$.

16. The phosphor composition of claim 14, comprising at least one of $(Lu_{0.97}Ce_{0.03})_3Al_{4.8}Si_{0.2}O_{11.8}N_{0.2}$, $(Lu_{0.97}Ce_{0.03})_3Al_{4.9}Si_{0.1}O_{11.9}N_{0.1}$, $(Y_{0.97}Ce_{0.03})_3Al_{4.9}Si_{0.1}O_{11.9}N_{0.1}$, and $(Y_{0.97}Ce_{0.03})_3Al_{4.8}Si_{0.2}O_{11.8}N_{0.2}$.

17. A phosphor blend including a first phosphor comprising an oxynitride phosphor composition having a formula $(RE_{1-x}Ce_x)_3Al_{a-y-z-w}Si_yGa_zSc_wO_{12-y}N_y$, where RE is at least one of Lu, Gd, Y, and Tb, $0.001 \leq x \leq 0.10$, $0 \leq w \leq 2$, $0.001 \leq y \leq 0.50$, $0 \leq z \leq 4.999$, and $4.5 \leq a \leq 5.0$; and at least one additional phosphor, wherein the phosphor blend is capable of emitting light suitable for use in general illumination either alone or in combination with radiation emitted by a light source radiationally coupled to the phosphor.

18. The phosphor blend of claim 17, wherein said first phosphor comprises at least one of $(Lu_{0.97}Ce_{0.03})_3Al_{4.8}Si_{0.2}O_{11.8}N_{0.2}$, $(Lu_{0.97}Ce_{0.03})_3Al_{4.9}Si_{0.1}O_{11.9}N_{0.1}$, $(Y_{0.97}Ce_{0.03})_3Al_{4.9}Si_{0.1}O_{11.9}N_{0.1}$, and $(Y_{0.97}Ce_{0.03})_3Al_{4.8}Si_{0.2}O_{11.8}N_{0.2}$.

19. The phosphor blend of claim 17, wherein said at least one additional phosphor comprises at least one of $(Sr, Ca)S:Ce^{3+},Eu^{2+}$; $(Sr, Ba, Ca)_2Si_{5-x}Al_xN_{8-x}O_x$: $Ce^{3+},Eu^{2+}$; and $BaSi_7N_{10}:Ce^{3+},Eu^{2+}$ 20. The phosphor blend of claim 17, wherein said at least one additional phosphor comprises at least one of $(Ba,Sr,Ca)_5(PO_4)_3(Cl,F,Br,OH):Eu^{2+}$, $Sb^{3+}$; $(Ba, Sr, Ca)MgAl10O_{17}$: $Eu^{2+},Mn^{2+}$; $(Ba, Sr, Ca)BPO_5:Eu^{2+}$, $Mn^{2+}$; $(Sr,Ca)_{10}(PO_4)_6*nB_2O_3:Eu^{2+}$; $2SrO*0.84P_2O_5*0.16B_2O_3:Eu^{2+}$; $Sr_2Si_3O_{8*2}SrCl_2:Eu^{2+}$; $Ba_3MgSi_2O_8:Eu^{2+}$; $Sr_4Al_{14}O_{25}$: $Eu^{2+}$; $BaAl_8O_{13}:Eu^{2+}$; $Sr_4Al_{14}O_{25}:Eu^{2+}$; $BaAl_8O_{13}:Eu^{2+}$; $(Ba,Sr,Ca)Al_2O_4:Eu^{2+}$; $(Y,Gd,Lu,Sc,La)BO_3:Ce^{3+}$, $Tb^{3+}$; $Ca_8Mg(SiO_4)_4Cl_2:Eu^{2+}$, $Mn^{2+}$; $(Ba,Sr,Ca)_2SiO_4:Eu^{2+}$; $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_5O_{12}:Ce^{3+}$; $(Ca,Sr)_8(Mg,Zn)(SiO_4)_4Cl_2$: $Eu^{2+}$, $Mn^{2+}$ (CASI); $Na_2Gd_2B_2O_7:Ce^{3+}$, $Tb^{3+}$; $(Ba,Sr)_2(Ca,Mg, Zn)B_2O_6:K, Ce, Tb$; $(Sr,Ca,Ba,Mg,Zn)_2P_2O_7:Eu^{2+}$, $Mn^{2+}$ (SPP); $(Ca,Sr,Ba, Mg)_{10}(PO_4)_6(F,Cl,Br,OH)$: $Eu^{2+}$, $Mn^{2+}$; $(Gd,Y,Lu,La)_2O_3:Eu^{3+}$, $Bi^{3+}$; $(Gd,Y,Lu,La)_2O_2S:Eu^{3+}$, $Bi^{3+}$; $(Gd,Y,Lu,La)VO_4:Eu^{3+}$, $Bi^{3+}$; $(Ca,Sr)S:Eu^{2+}$; $SrY_2S_4$: $Eu^{2+}$; $CaLa_2S_4:Ce^{3+}$; $3.5MgO*0.5MgF_2*GeO_2:Mn^{4+}$; $(Ba,Sr,Ca)MgP_2O_7:Eu^{2+}$, $Mn^{2+}$; $(Y,Lu)_2WO_6:Eu^{3+}+, Mo^{6+}$; $(Ba,Sr,Ca)_xSi_yN_z:Eu^{2+}$.

21. The lighting apparatus of claim 1, wherein $0<w$.

22. The phosphor composition of claim 14, wherein $0<w$.

23. The phosphor blend of claim 17, wherein $0<w$.

* * * * *